(12) United States Patent
Feldman et al.

(10) Patent No.: US 11,237,218 B2
(45) Date of Patent: Feb. 1, 2022

(54) BATTERY STATE ESTIMATION

(71) Applicant: Google LLC, Mountain View, CA (US)

(72) Inventors: Arnold R. Feldman, San Francisco, CA (US); Dennis Gee-Wai Yee, San Francisco, CA (US)

(73) Assignee: Google LLC, Mountain View, CA (US)

( * ) Notice: Subject to any disclaimer, the term of this patent is extended or adjusted under 35 U.S.C. 154(b) by 239 days.

(21) Appl. No.: 16/482,083

(22) PCT Filed: Jun. 25, 2018

(86) PCT No.: PCT/US2018/039312
§ 371 (c)(1),
(2) Date: Jul. 30, 2019

(87) PCT Pub. No.: WO2020/005196
PCT Pub. Date: Jan. 2, 2020

(65) Prior Publication Data
US 2020/0174080 A1   Jun. 4, 2020

(51) Int. Cl.
*G01R 31/389* (2019.01)
*G01R 31/3842* (2019.01)
(Continued)

(52) U.S. Cl.
CPC ......... *G01R 31/389* (2019.01); *G01R 31/374* (2019.01); *G01R 31/3842* (2019.01); *H02J 7/007182* (2020.01)

(58) Field of Classification Search
CPC .............. G01R 31/389; G01R 31/3842; G01R 31/374; G01R 31/382; H02J 7/007182; H02J 7/00306; H02J 7/0029; Y02T 10/70
(Continued)

(56) References Cited

U.S. PATENT DOCUMENTS 7,034,503 B2 * 4/2006 Veselic ............... H02J 7/008
320/128
7,200,500 B2 * 4/2007 Larsson ............... H02J 3/00
702/64
(Continued)

FOREIGN PATENT DOCUMENTS

CN    103427123    8/2015
CN    104765396    7/2016
(Continued)

OTHER PUBLICATIONS

"International Search Report and Written Opinion", PCT Application No. PCT/US2018/039312, dated Nov. 9, 2018, 15 pages.
(Continued)

*Primary Examiner* — M Baye Diao
(74) *Attorney, Agent, or Firm* — Colby Nipper PLLC

(57) ABSTRACT

This document describes techniques and systems that enable battery state estimation. The techniques and systems may be used to determine a shut-down voltage for a battery of an electronic device. Additionally or alternatively, the techniques and systems may be used to determine a state-of-charge of the battery, which may be determined relative to the shut-down voltage. The techniques and systems use current or expected conditions at the battery to estimate the battery state. These techniques can allow the electronic device to dynamically set a shut-down voltage, rather than using a fixed shut-down voltage over the life of the electronic device. The dynamically set shut-down voltage can provide a low margin, and therefore a greater portion of battery capacity, when operating in good conditions and provide a relatively large margin that is sufficient for poor conditions.

20 Claims, 10 Drawing Sheets

(51) Int. Cl.
*G01R 31/374* (2019.01)
*H02J 7/00* (2006.01)

(58) Field of Classification Search
USPC .......................................................... 320/137
See application file for complete search history.

(56) References Cited

U.S. PATENT DOCUMENTS

| | | | | |
|---|---|---|---|---|
| 7,723,958 | B2* | 5/2010 | Darilek | G01R 31/3828 |
| | | | | 320/132 |
| 7,808,210 | B2* | 10/2010 | Darilek | H01M 10/48 |
| | | | | 320/132 |
| 7,990,109 | B2 | 8/2011 | White et al. | |
| 8,849,598 | B2* | 9/2014 | Mingant | G01R 31/389 |
| | | | | 702/63 |
| 9,015,513 | B2* | 4/2015 | Murawski | G06F 1/3212 |
| | | | | 713/340 |
| 9,035,616 | B2 | 5/2015 | Wortham | |
| 9,052,368 | B2 | 6/2015 | Wortham et al. | |
| 9,131,452 | B2* | 9/2015 | Bartels | H04W 52/223 |
| 9,472,967 | B2* | 10/2016 | Nunez | H02J 7/0048 |
| 9,707,858 | B2 | 7/2017 | Deisler | |
| 9,774,203 | B2 | 9/2017 | Childress et al. | |
| 9,851,414 | B2* | 12/2017 | Morrison | G01R 31/389 |
| 10,237,830 | B1* | 3/2019 | Jia | H04W 52/0261 |
| 10,338,153 | B2* | 7/2019 | Adagouda Patil | G01R 31/392 |
| 2004/0263127 | A1* | 12/2004 | Turner | H02J 7/345 |
| | | | | 320/166 |
| 2009/0002122 | A1* | 1/2009 | Tsai | H02J 1/14 |
| | | | | 338/22 R |
| 2009/0030476 | A1* | 1/2009 | Hargrove | A61N 1/36031 |
| | | | | 607/40 |
| 2013/0275067 | A1 | 10/2013 | Mikuteit et al. | |
| 2015/0066837 | A1 | 3/2015 | Twarog et al. | |
| 2015/0119094 | A1 | 4/2015 | Bartels et al. | |
| 2016/0259014 | A1* | 9/2016 | Adagouda Patil | G01R 31/392 |
| 2017/0170672 | A1* | 6/2017 | Yebka | H01M 10/486 |
| 2020/0083706 | A1* | 3/2020 | Paskov | H02J 7/00 |

FOREIGN PATENT DOCUMENTS

| | | | | |
|---|---|---|---|---|
| CN | 110707380 | A * | 1/2020 | .......... G01R 31/389 |
| FR | 3044423 | | 6/2017 | |
| IN | 202047027772 | | 8/2020 | |
| JP | 2015182518 | | 10/2018 | |

OTHER PUBLICATIONS

"International Preliminary Report on Patentability", Application No. PCT/US2018/039312, dated Dec. 29, 2020, 9 pages.

"Foreign Office Action", IN Application No. 202047027772, dated May 13, 2021, 7 pages.

* cited by examiner

BATTERY STATE ESTIMATION

BACKGROUND

Mobile electronic devices are used for communication, navigation, shopping, game-play, augmented-reality (AR) interactions, and many other functions. With constant improvement of computing speeds, wireless communication bandwidth, and displays, mobile electronic devices are demanding increasing amounts of power. In addition to the demand for increasing amounts of power, consumers seek out mobile electronic devices that are light-weight, thin, and designed to last a full day on a single charge. For these reasons, an efficient and well-configured battery is important for mobile electronic devices.

Conventional mobile electronic devices are configured with a fixed undervoltage lockout (UVLO) voltage level, such that when a battery of a mobile electronic device is below the UVLO, a mobile electronic device may suffer a system failure. To prevent falling below the UVLO voltage level and causing a system failure, the mobile device is also configured with a fixed shut-down voltage ("0% state" or "empty voltage") level that is set at a fixed margin above the UVLO voltage level. When a voltage level of the battery falls below the empty voltage level, the mobile electronic device can safely shut down without falling below the UVLO voltage level. However, when configuring the battery, manufacturers must decide between setting the empty voltage level at a fixed margin that is configured for poor conditions, which unnecessarily reduces battery capacity when operating in good conditions, or at a fixed margin that is configured for good conditions, which risks falling below the UVLO when operating in poor conditions.

SUMMARY

This document describes techniques and systems that enable battery state estimation for electronic devices. More particularly, the techniques and systems may be used to determine a shut-down voltage for a battery of an electronic device. Additionally or alternatively, the techniques and systems may be used to determine a state-of-charge of the battery, which may be determined relative to the shut-down voltage. The techniques and systems use current or expected conditions at the battery to estimate the battery state. These techniques can allow the electronic device to dynamically set a shut-down voltage, rather than use a fixed shut-down voltage over the life of the electronic device. The dynamically-set shut-down voltage can provide a lower UVLO margin, and therefore a greater portion of battery capacity, when operating in good conditions. Alternatively, the dynamically-set shut-down voltage can provide a relatively large UVLO margin when operating in poor conditions.

In some aspects, an electronic device determines the impedance of the battery in the electronic device. The determination is based on conditions at the battery, such as temperature or cycle count. Based on the determined impedance of the battery, the electronic device also determines a voltage margin for voltage transients. The electronic device then sets a shut-down voltage for the electronic device based on a sum of the voltage margin and an undervoltage lockout (UVLO) voltage level.

In other aspects, an electronic device includes one or more processors, a battery, and one or more computer-readable media having instructions stored thereon. Responsive to execution by the one or more processors, the instructions implement a battery manager that is configured to perform operations for setting a shut-down voltage for the electronic device. The operations include determining an impedance of the battery based on conditions at the battery. The operations also include determining a current draw of an available operation of the electronic device. Another operation includes determining a voltage margin for voltage transients based on the impedance of the battery and the current draw of the available operation. Further, the operations include setting a shut-down voltage for the electronic device. The shut-down voltage is based on a sum of the voltage margin for voltage transients and a UVLO voltage level.

In further aspects, an electronic device includes one or more processors, a battery, an I/O interface, and one or more computer-readable media having instructions stored thereon. Responsive to execution by the one or more processors, the instructions implement a battery manager that is configured to perform operations for providing a state-of-charge of the battery. The operations include determining conditions at the battery. The conditions include one or more of a cycle count of the battery or a temperature condition at the battery. The operations also include determining an impedance of the battery based on the conditions at the battery. Another operation includes determining, based on the impedance of the battery, a state-of-charge of the battery. Further, the operations include providing, via the I/O interface, an indication of the state-of-charge of the battery.

The details of one or more implementations are set forth in the accompanying drawings and the following description. Other features and advantages will be apparent from the description and drawings, and from the claims. This summary is provided to introduce subject matter that is further described in the Detailed Description and Drawings. Accordingly, this summary should not be considered to describe essential features nor used to limit the scope of the claimed subject matter.

BRIEF DESCRIPTION OF THE DRAWINGS

The details of one or more aspects of battery state estimation are described below. The use of the same reference numbers in different instances in the description and the figures indicate similar elements.

DETAILED DESCRIPTION

Overview

Figure 1:
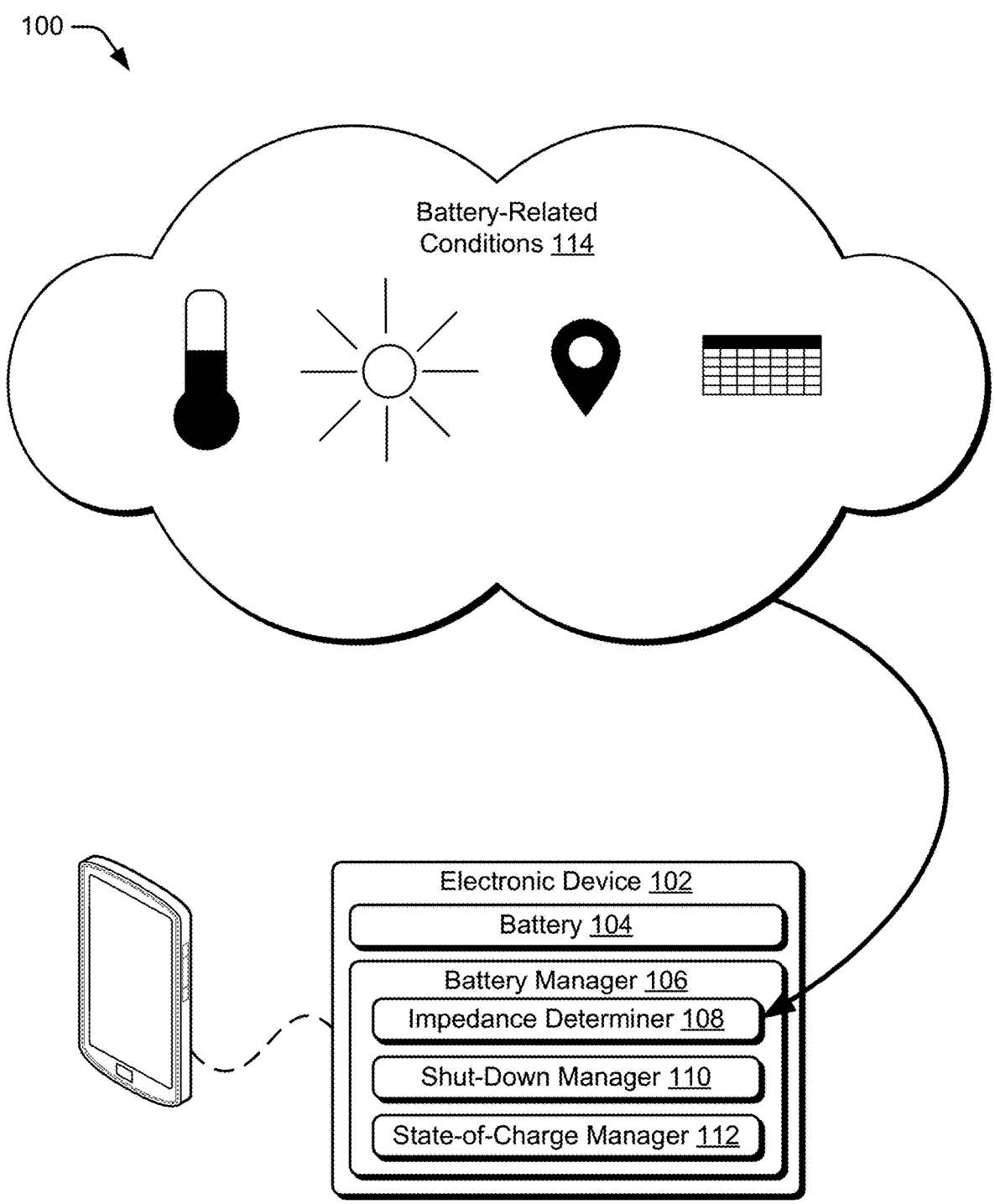
FIG. 1 illustrates an example operating environment in which battery state estimation can be implemented.

Conventional mobile electronic devices are configured with a fixed shut-down voltage that is a fixed margin above an undervoltage lockout (UVLO) voltage level. When configuring the fixed shut-down voltage, the margin may be determined based on a current battery state or an expected battery state. For example, a manufacturer may determine the margin to prevent falling below the UVLO voltage level when the battery is 1000 cycles old and operating at freezing temperatures. This would result in a relatively high margin and a relatively high shut-down voltage. In this case, the battery would unnecessarily restrict access to additional battery capacity when the electronic device operates in more-favorable conditions. In another example, the manufacturer may determine the margin to prevent falling below the UVLO voltage level when the battery is new and operating at room temperature. This would result in a relatively low margin and a relatively low shut-down voltage. In this case the battery would allow access to the additional battery capacity, but risks falling below the UVLO when the battery ages or operates at cool temperatures.

This document describes techniques and systems for battery state estimation. These techniques may include dynamically determining a shut-down voltage that is based on conditions at the battery. These techniques may further include determining a charge state of the battery, relative to the determined shut-down voltage. Battery state estimation may be used to direct a battery to grant access to additional battery capacity when conditions allow. Additionally, battery state estimation may be used to restrict access to additional battery capacity when conditions would make such access likely to cause the battery voltage to fall below the UVLO. Further, battery state estimation may be used to provide an improved indication of the battery state, such as a remaining amount of usable battery capacity.

In an illustrative example, in response to charging an electronic device, the electronic device determines battery-related conditions. The battery-related conditions may include an age (e.g., a cycle count) of the battery, a current temperature, a forecasted temperature, a location of the battery, and expected behavior of a user of the electronic device. For example, assume that a mobile phone determines that a current temperature is room temperature, the mobile phone is in Park City, Utah, the forecasted temperature at Park City is below freezing, and a calendar accessed by the mobile phone indicates that the user has planned an eight-hour skiing outing. The mobile phone accounts for the battery-related conditions to determine an impedance, or expected impedance, of the battery at various times of a next cycle of the battery. The mobile phone may use the determined impedance to predict when a battery of the mobile phone will be low and a shut-down may be necessary. For example, the mobile phone may predict that the mobile phone will be in freezing temperatures at a time of approaching a potential need to shut down. The mobile phone may use the expected freezing temperatures and a current cycle count to determine an expected impedance of the battery at the time of approaching the potential need to shut down. Using the expected impedance, the mobile phone sets the shut-off voltage as a 0% state-of-charge. Throughout the battery cycle, the user device displays a percentage state-of-charge calibrated with the set shut-off voltage as 0%.

The following discussion describes devices and techniques that may be employed in the operating environment and/or network environment. In the context of the present disclosure, reference is made to the operating environment.

Operating Environment

FIG. 1 illustrates an example environment 100 in which techniques enabling battery state estimation can be implemented. The example environment 100 includes an electronic device 102, which includes, or is associated with, a battery 104 and a battery manager 106. The battery manager 106 includes an impedance determiner 108, a shut-down manager 110, and a state-of-charge manager 112. The impedance determiner 108 receives battery-related conditions 114 to determine an impedance of the battery 104 for a current or next cycle of the battery 104.

The battery-related conditions 114 may include one or more of a cycle count of the battery 104 or a temperature condition. The cycle count may be a significant factor for determining the impedance of the battery 104, as experimentation has shown that the impedance of the battery 104 can double with regular usage over a two-year lifespan of the battery 104. Temperature conditions may also be a significant factor for determining the impedance of the battery 104, as additional experimentation has shown that the impedance of the battery can triple, relative to impedance at room temperature, when operating at freezing temperatures. As illustrated, the temperature conditions may include one or more of temperature, forecast, location, or scheduled behavior of a user of the electronic device 102. The temperature conditions may include one or more of current temperature conditions or expected temperature conditions. Further, the temperature conditions may include a lowest temperature of a plurality of expected temperatures at the battery 104 during a current cycle or a next cycle.

The impedance determiner 108 determines an impedance of the battery 104 using the battery-related conditions 114. Because the battery-related conditions 114 at the battery 104 may change throughout the battery cycle, the impedance determiner 108 may expect that the impedance of the battery 104 will also change. The impedance determiner 108 may consider a highest-expected impedance of the battery 104 during the current or next cycle as the determined impedance. For example, the determined impedance may be based on a lowest temperature of the temperatures expected temperatures at the battery during the current or next cycle. Alternatively, the determined impedance may be expressed as an average impedance throughout an expected duration of the cycle, weighted by time spent at expected impedance values of the cycle. The battery manager 106 may use the expected impedance throughout the battery cycle to determine an available capacity of the battery 104, based on an increased impedance. For example, the battery manager 106 may determine that, based on the increased impedance, the battery 104 has an available capacity of 2,000 mAh. The battery manager 106 may further determine an efficiency of the battery based on the impedance of the battery 104.

Based on the determined impedance, the shut-down manager 110 determines a shut-down voltage. The shut-down voltage is a voltage such that, when a voltage level of the battery 104 falls to, or below, the shut-down voltage, the battery manager 106 triggers a safe shut-down of the electronic device 102. The shut-down manager 110 may determine the shut-down voltage as a voltage level that is a margin above the UVLO. To determine the margin, the shut-down manager 110 may use the determined impedance that is a highest expected impedance for the current or next cycle. Alternatively, the determined impedance may be an expected impedance at an expected shut-down time. The expected shut-down time is a time at which the electronic device 102 expects the battery 104 to be nearing the UVLO, or a voltage that is within a threshold of the UVLO that indicates a potential need to shut-down. This expected shut-down time may be based on prior battery cycles. For example, if an average cycle of the battery 104 at the determined impedance lasts for 15 hours, the shut-down manager may use an expected impedance at 15 hours from the start of the cycle to determine the margin and shut-down voltage. Additionally or alternatively, the expected shut-down time may account for conditions, such as a weather forecast or events scheduled on a calendar stored on, or accessible to, the electronic device 102.

The state-of-charge manager 112 determines a current state-of-charge of the battery 104. The state-of-charge may be expressed as a percentage of remaining charge which is a nonlinear function of battery open circuit voltage. The electronic device 102 may provide an indication of the state-of-charge of the battery 104. The electronic device 102 may provide the indication display the state-of-charge using a visual indication, an audible indication, or a haptic indication.

Figure 2:
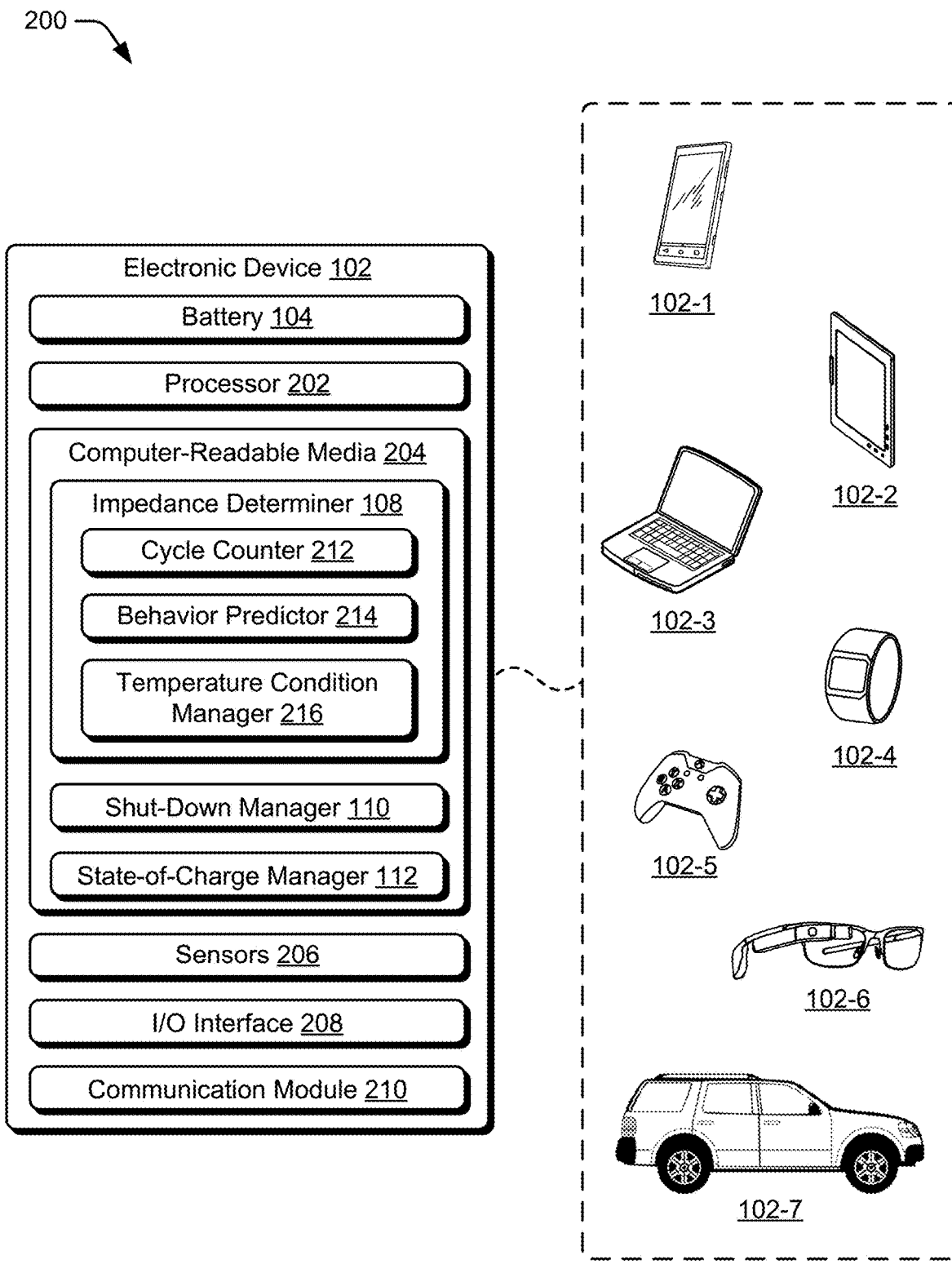
FIG. 2 illustrates an example implementation of the electronic device of FIG. 1 in which battery state estimation can be implemented.

FIG. 2 illustrates an example implementation of the electronic device 102 of FIG. 1 in which battery state estimation can be implemented. The electronic device 102 is illustrated with various non-limiting example devices, including a smartphone 102-1, a tablet 102-2, a laptop 102-3, a computing watch 102-4, a gaming system 102-5, computing spectacles 102-6, and a vehicle 102-7. The electronic device 102 can also include other devices, such as televisions, entertainment systems, audio systems, drones, track pads, drawing pads, netbooks, e-readers, home-automation and control systems, home security systems, and other home appliances. Note that the electronic device 102 can be wearable, non-wearable but mobile, or relatively immobile (e.g., desktops and appliances).

The electronic device 102 also includes one or more computer processors 202 and one or more computer-readable media (CRM) 204, which includes memory media and storage media. Applications and/or an operating system (not shown) implemented as computer-readable instructions on the computer-readable media 204 can be executed by the computer processors 202 to provide some of the functionalities described herein. The electronic device 102 may also include sensors 206, such as one or more of a thermocouple, a voltmeter, an ammeter, a barometer, an ohmmeter, or a proximity sensor. An input/output (I/O) interface 208 of the electronic device 102 may be used to receive input from a user or to provide information to the user. The electronic device 102 may also include a communication module 210 for communicating data over wired, wireless, or optical networks. By way of example and not limitation, the communication module 210 may communicate data over a local-area-network (LAN), a wireless local-area-network (WLAN), a personal-area-network (PAN), a wide-area-network (WAN), an intranet, the Internet, a peer-to-peer network, point-to-point network, or a mesh network.

The CRM 204 includes one or more of the impedance determiner 108, the shut-down manager 110, or the state-of-charge manager 112 of FIG. 1. The impedance determiner 108 includes one or more of a cycle counter 212, a behavior predictor 214, or a temperature condition manager 216. The cycle counter 212 tracks a quantity of charge-discharge cycles of the battery 104. The cycle counter 212 may account for partial cycles, such as when the battery 104 is not fully discharged before beginning to charge or when the battery 104 is not fully charged before beginning to discharge.

The behavior predictor 214 uses contextual data to determine expected conditions at the battery 104. For example, the behavior predictor 214 may access a calendar to determine scheduled events to which the battery 104 will likely be taken. The behavior predictor 214 may use machine learning to predict behavior, such as expected length of time until a next charge, an expected amount of time the electronic device 102 will be inside or outside, or a location to which the electronic device 102 is likely to travel during the current or next cycle. The machine learning may be based on previous cycles of the electronic device 102 or previous behavior of other electronic devices under similar conditions, such as a similar location that is an unusual location for the electronic device 102.

The temperature condition manager 216 may measure current temperature-related conditions, such as a temperature, a pressure, or a humidity at the battery 104. The temperature condition manager 216 may further access external sources, such as the internet, to predict expected temperature conditions. For example, using the predicted behavior from the behavior predictor 214, the temperature conditions manager may access a weather forecast to determine expected temperature conditions at the battery 104 during the scheduled events.

Figure 3:
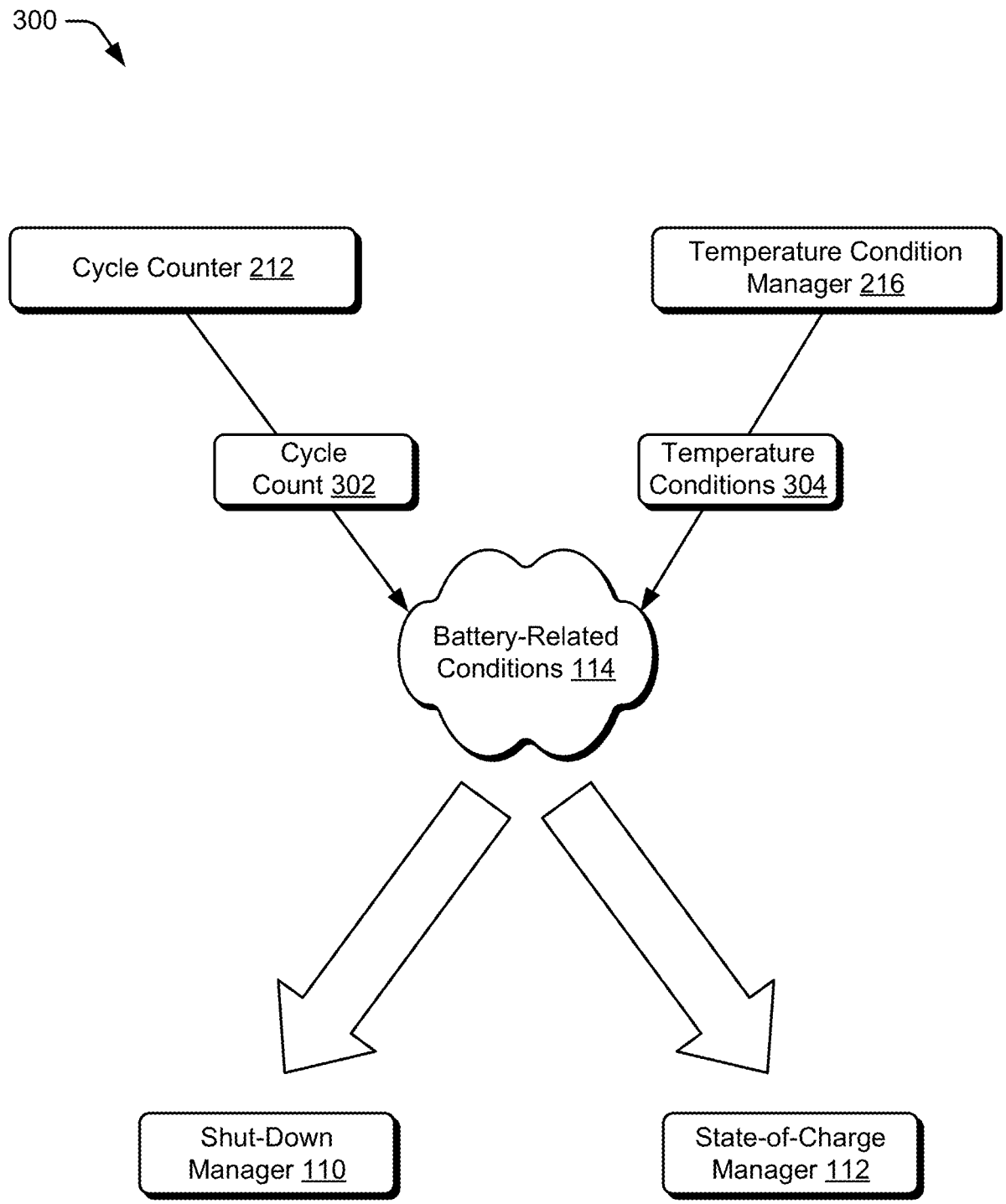
FIG. 3 illustrates an example implementation of the cycle counter, the temperature condition manager, the shut-down manager, and the state-of-charge manager of FIGS. 1 and 2.

As illustrated in FIG. 3, the cycle counter 212 provides a cycle count 302 as one of the battery-related conditions 114 and the temperature condition manager 216 provides temperature conditions 304 as one or more of the battery-related conditions 114. The battery-related conditions 114 are then provided to one or more of the shut-down manager 110 or the state-of-charge manager 112.

Returning again to FIG. 2, various implementations of the impedance determiner 108, the shut-down manager 110, the state-of-charge manager 112, the cycle counter 212, the behavior predictor 214, or the temperature condition manager 216 can include a System-on-Chip (SoC), one or more Integrated Circuits (ICs), a processor with embedded processor instructions or configured to access processor instructions stored in memory, hardware with embedded firmware, a printed circuit board with various hardware components, or any combination thereof.

Figure 4:
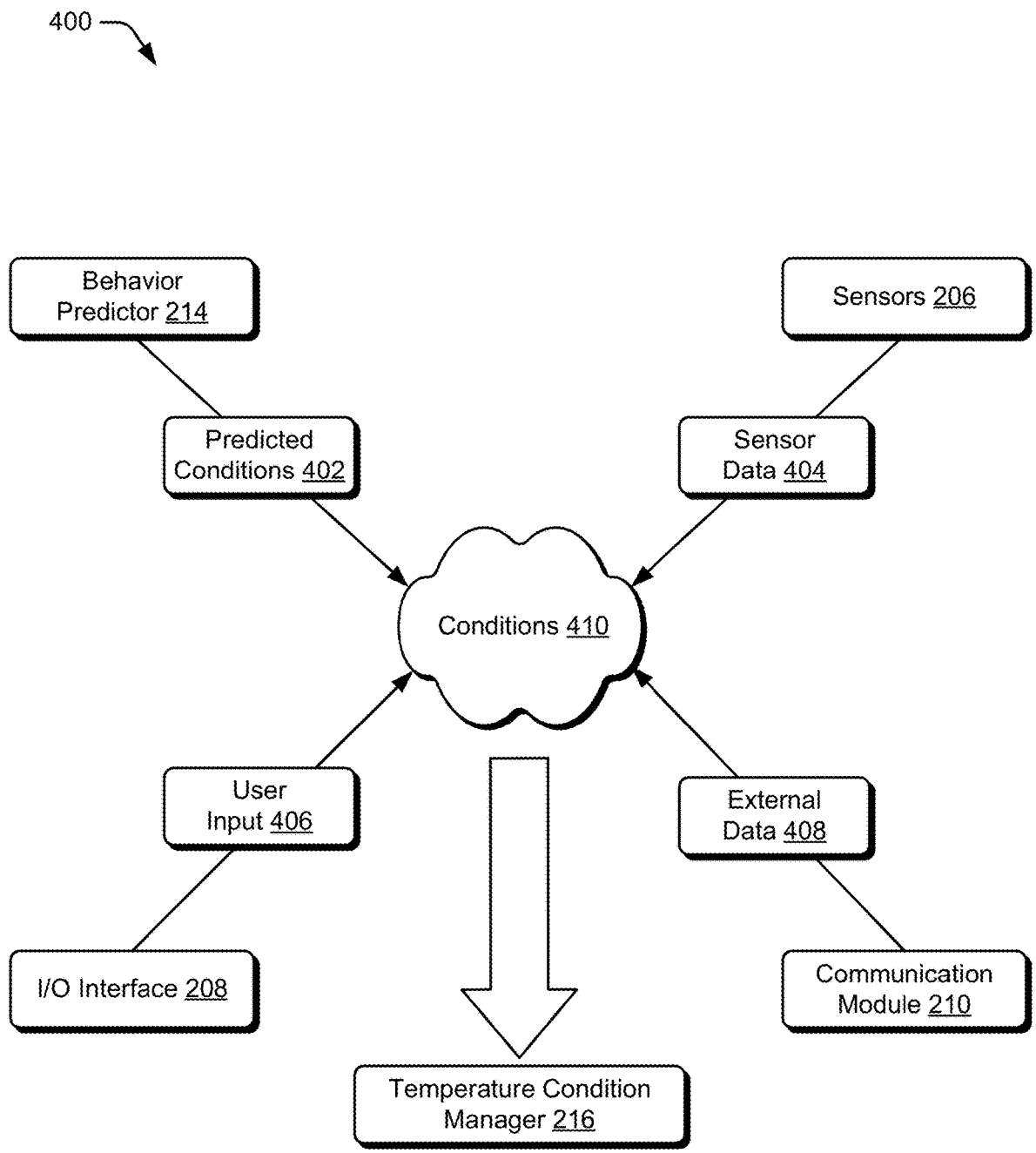
FIG. 4 illustrates an example implementation of the temperature condition manager of FIG. 2.

FIG. 4 illustrates an example implementation of the temperature condition manager 216. As illustrated, one or more of the sensors 206, the I/O interface 208, the communication module 210 and the behavior predictor 214 provide one or more conditions 410 to the temperature condition manager 216. The temperature condition manager 216 then determines the temperature conditions 304 for the current or next cycle of the battery 104.

The behavior predictor 214 provides predicted conditions 402, such as an expected location of the battery 104 or an expected duration of the battery cycle. The sensors 206 provide sensor data 404, such as a current temperature at the battery 104 or the electronic device 102, a current voltage of the battery 104, a current impedance of the battery 104, or a barometric reading at the battery 104. The I/O interface 208 receives user input 406 and provides the user input 406 as conditions 410 to the temperature condition manager 216. The user input 406 may include selection inputs, as further described with respect to FIG. 6, below. The communication module 210 provides external data 408 as conditions 410 to the temperature conditions manager 216. The communication module 210 may retrieve the external data 408 from a remote service provider, such as a weather forecast provider or a location-based behavior predictor, or may search the internet for the external data 408 that may provide predictive information for the temperature condition manager 216.

The temperature condition manager 216 determines the temperature conditions 304, based on one or more of the conditions 410 provided by one or more of the sensors 206, the I/O interface 208, the communication module 210 and the behavior predictor 214. In some implementations, the conditions from one source are combined with conditions from another source to generate the temperature conditions. For example, the predicted conditions 402 including a scheduled trip for skiing in Park City may be combined with the external data 408 including a temperature forecast for Park City during the scheduled trip. Alternatively, user input 406 including an indication that the user will remain indoors for a conference in Stockholm, Sweden, rather than going outside in sub-zero temperatures may be combined with the external data 408 accessing a common room-temperature for the conference center.

Figure 5:
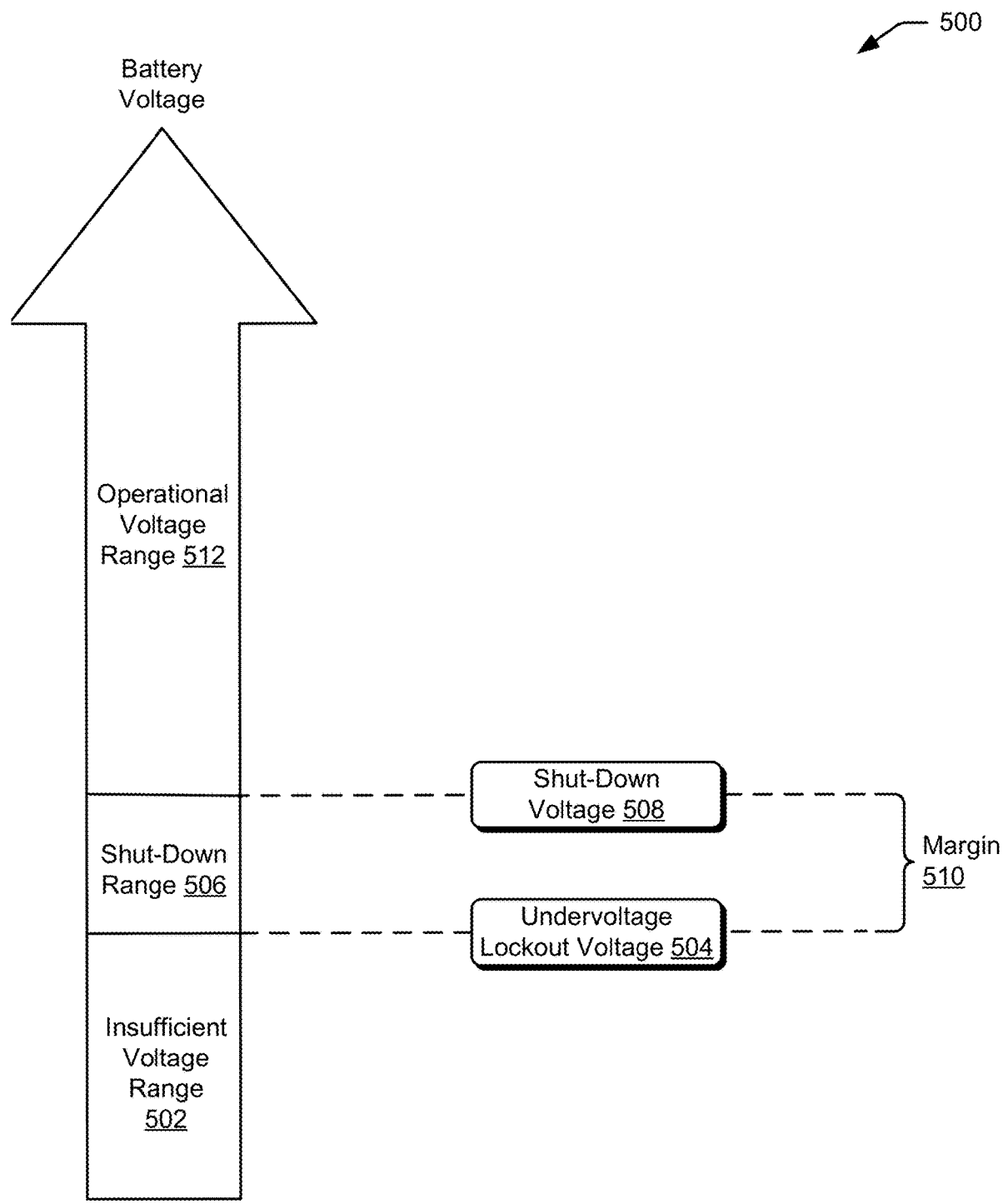
FIG. 5 illustrates example voltages of the battery of FIG. 1, which include an undervoltage lockout voltage and a shut-down voltage.

FIG. 5 illustrates example voltages of the battery 104 of FIG. 1. A range of voltages for the battery 104 includes in insufficient voltage range 502, a UVLO voltage 504, a shut-down range 506, a shut-down voltage 508 that is a margin 510 above the UVLO voltage 504, and an operational voltage range 512.

When the voltage of the battery 104 is in the insufficient voltage range 502, the electronic device 102 may malfunction because the voltage is unable to power operations of the electronic device 102. For example, individual electrical components may not function properly based on the voltage across an input and an output of the electrical component. If the voltage falls into the insufficient voltage range 502, the device may brown-out, lose data, or receive damage to the electrical components. The UVLO voltage 504 indicates an upper limit of the insufficient voltage range 502 and a lower limit of the shut-down range 506.

When the voltage of the battery 104 is in the shut-down range 506, the electronic device 102 is configured to shut-down to avoid falling below the UVLO voltage 504. Within the shut-down range 506, the electronic device 102 can safely shut-down without browning-out, losing data, or receiving damage to the electrical components.

The shut-down voltage 508 indicates an upper limit of the shut-down range 506 and a lower limit of the operational voltage range 512. The margin 510 is based on voltage transients when performing an operation of the electronic device 102, such as taking a photo and processing the photo. The voltage transients may be calculated as a product of a current draw for an operation, such as a highest current-drawing operation, and an impedance of the battery 104. This product is a voltage transient because it is an amount of voltage drop that is internal to the battery 104, and unavailable for operations of the electronic device 102. The voltage transients may reduce an effective voltage as observed by the electronic device 102. For this reason, the shut-down voltage 508 is set based on the margin 510 to reduce a likelihood of an effective voltage falling below the UVLO voltage 504 during an operation.

When a voltage of the battery 104 is in the operational voltage range 512, the electronic device 102 can perform operations without falling below the UVLO voltage 504. For this reason, the shut-down voltage 508 may be set as a 0% state-of-charge. A current state-of-charge of the battery 104 may be calculated relative to the shut-down voltage 508 and a full-charge voltage.

If the shut-down voltage 508 is determined incorrectly, a highest current-drawing operation performed at a temperature that is colder than expected may cause the battery to fall below the UVLO voltage. For this reason, the shut-down voltage 508 may be set based on a sum of the margin that is calculated for voltage transients and an additional buffer to account for variance from expected battery-related conditions 114, such as the conditions 410.

Figure 6:
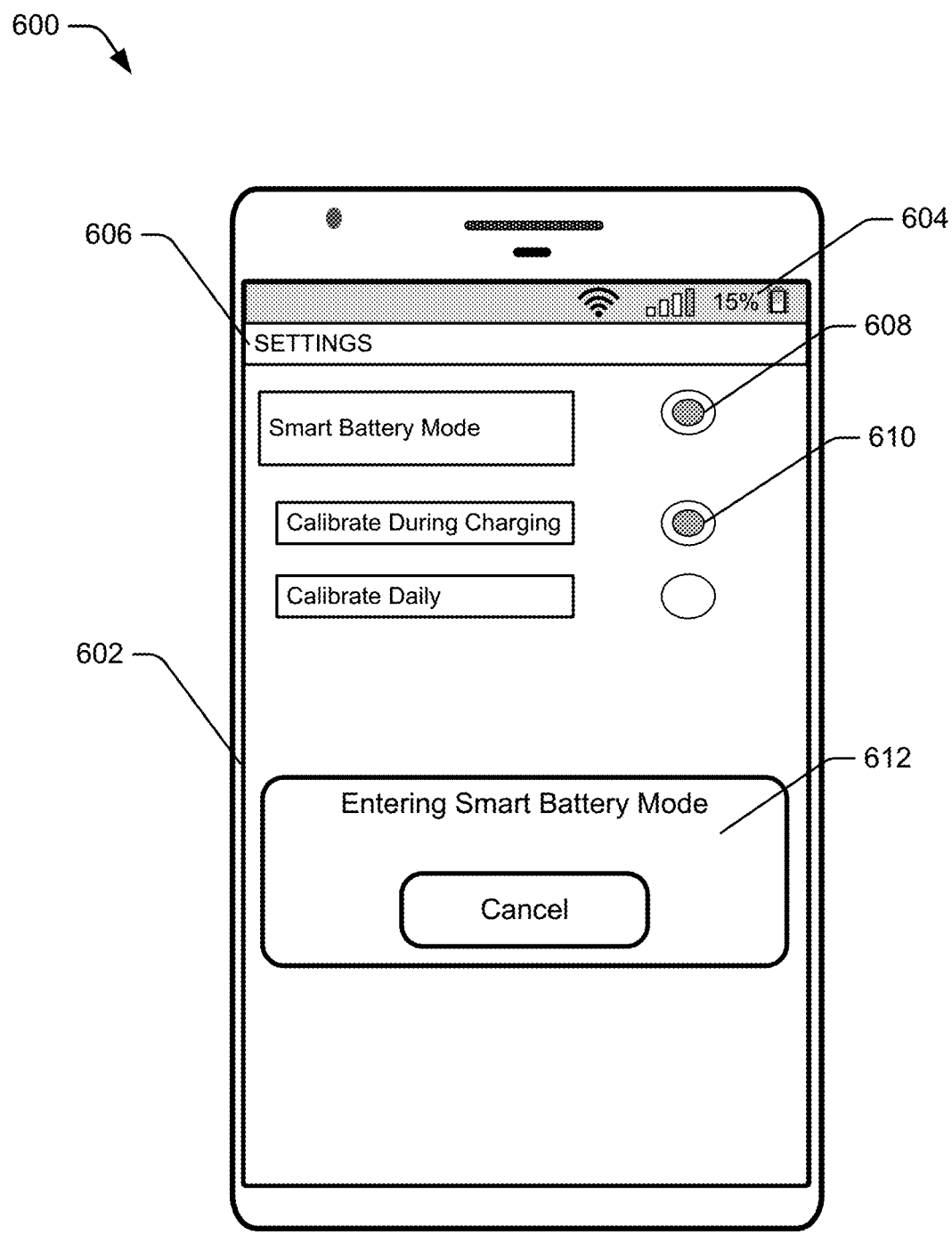
FIG. 6 illustrates an example user interface of the electronic device of FIG. 1 through which a user may provide input to, and receive output from, the electronic device in accordance with one or more aspects of battery state estimation.

FIG. 6 illustrates an example user interface 600 of the electronic device 102 through which one or more aspects of battery state estimation can be implemented. In this example, the user interface 600 is presented through a visible portion of a display 602 for providing output to a user. The display 602 may also include, or be integrated with, a touch screen or touch-sensitive overlay for receiving touch input from the user. The display 602 may also display a power level indicator 604 of the electronic device 102. The power level indicator 604 may be a visual indicator, such as a percentage of remaining power or a representation of a fraction of remaining power. In some cases, the display 602 provides or makes accessible a settings menu 606 through which the user interface 600 can receive input 608 to enter a smart battery mode. The settings menu 606 can receive a further input 610 to request one or more rules for the smart battery mode. For example, the input 610 may request calibrating, or updating, the shut-down voltage daily, based on a change in power settings (e.g., entering or exiting a power saving mode), or in response to charging the battery 104. Alternatively, the input 610 may allow for calibrating, or updating, the shut-down voltage when the battery manager 106 receives updated battery-related conditions 114.

Additionally or alternatively, the electronic device 102 may provide a notification 612 via the user interface 600 to indicate that the electronic device 102 is entering the smart battery mode, based on the input 608. The notification may also indicate that the shut-down voltage is updating based on updated battery-related conditions 114. The notification 612 is illustrated in this example as a pop-up notification in the display 602, however, other forms of notification 612 may be implemented in addition or in alternative to the pop-up notification. For example, the user device 102 may provide an audible notification, a visible notification via a light emitting diode (LED) indicator that is separate from the display 602, or a motion-based notification such as a vibration of the electronic device 102.

The user interface 600 is but one of many possible user interfaces for implementing battery state estimation. Although the electronic device 102 is illustrated as a smart phone with a touch screen, alternative user interfaces may be implemented by the electronic device 102. For example, the electronic device 102 may be implemented as a laptop with a user interface including one or more of a mouse, a track pad, a keyboard, a microphone, a monitor, a projector screen, or speakers. In some implementations, the user interface 600 does not include the settings menu 606 for receiving the inputs 608 or 610, but rather, the electronic device 102 enters the smart battery mode automatically and without receiving user input.

Techniques for Battery State Estimation

Figure 7:
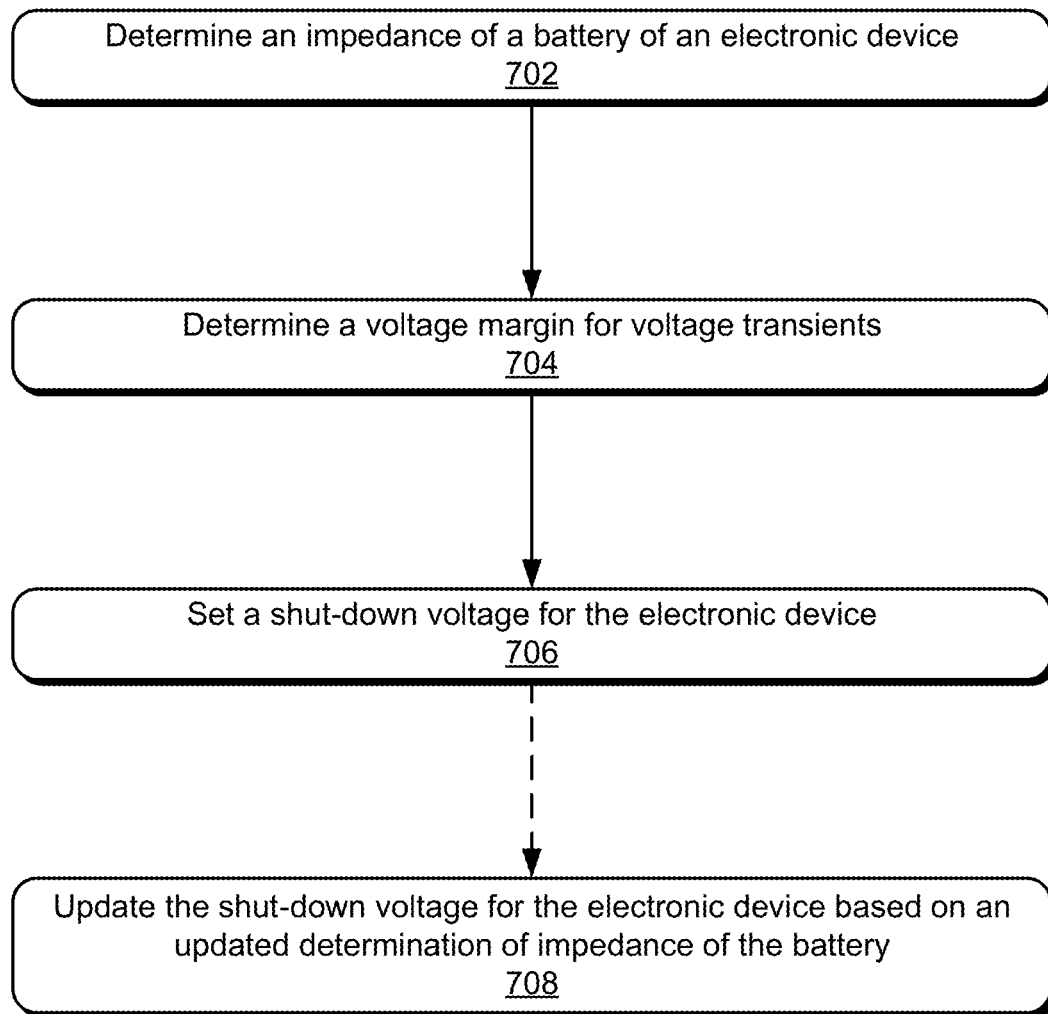
FIG. 7 illustrates an example method performed by the electronic device of FIG. 1 for setting a shut-down voltage for the electronic device of FIG. 1.
Figure 8:
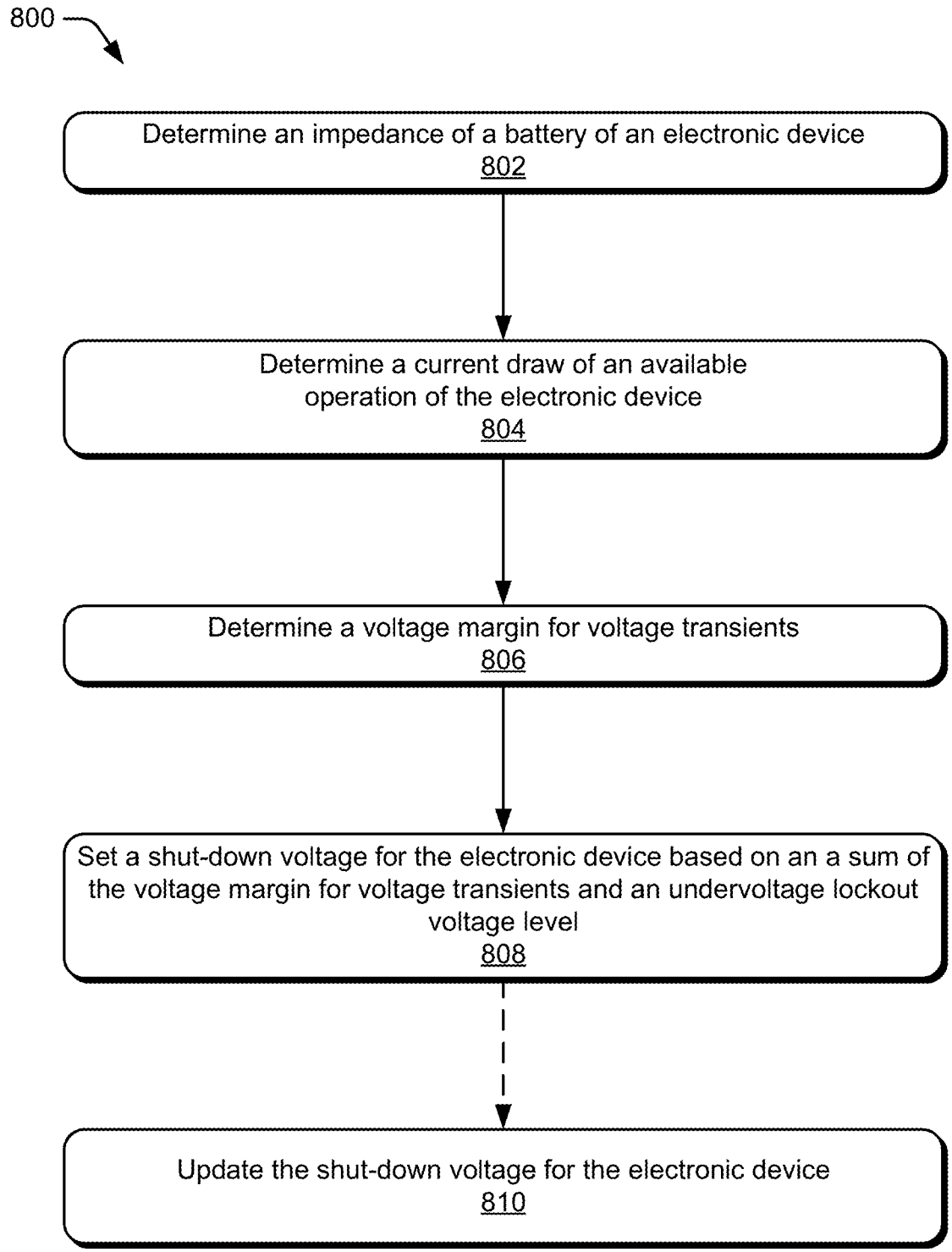
FIG. 8 illustrates an example method performed by the electronic device of FIG. 1 for setting a shut-down voltage for the electronic device of FIG. 1.
Figure 9:
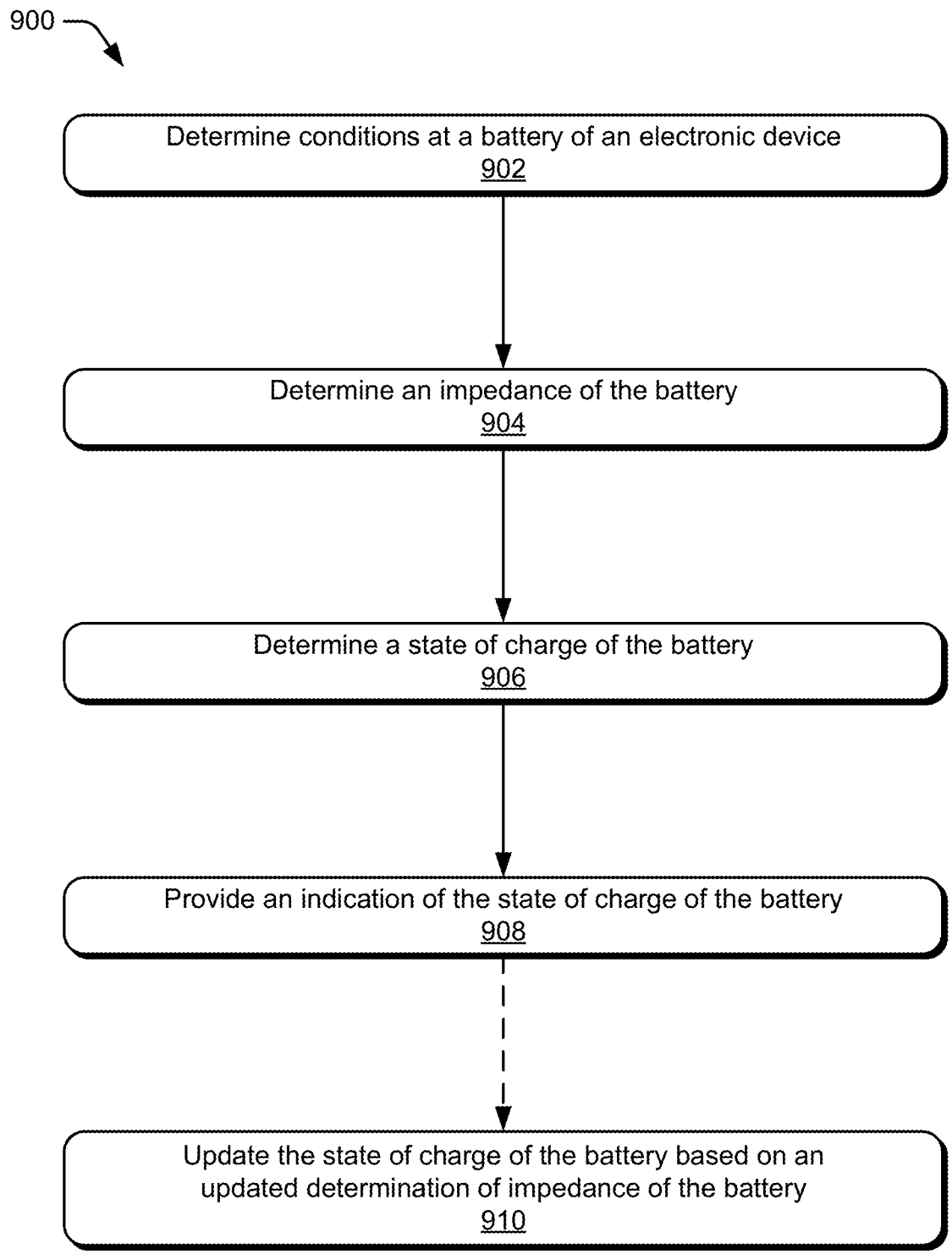
FIG. 9 illustrates an example method performed by the electronic device of FIG. 1 for providing an indication of the state-of-charge for the battery of the electronic device of FIG. 1.

FIGS. 7-9 depict methods for implementing battery state estimation. These methods are shown as sets of blocks that specify operations performed but are not necessarily limited to the order or combinations shown for performing the operations by the respective blocks. For example, operations of different methods may be combined, in any order, to implement alternate methods without departing from the concepts described herein. In portions of the following discussion, the techniques may be described in reference to FIGS. 1-6, reference to which is made for example only. The techniques are not limited to performance by one entity or multiple entities operating on one device, or those described in these figures.

FIG. 7 illustrates an example method 700 performed by an electronic device for battery state estimation. The method 700 includes operations that may be performed by one or more of the battery manager 106, the impedance determiner 108, or the shut-down manager 110. In some aspects, operations of the method 700 may improve battery use of an electronic device by calibrating a shut-off voltage based on battery-related conditions.

At operation 702, an electronic device determines an impedance of a battery of the electronic device. The electronic device determines the impedance based on conditions at the battery. For example, the impedance determiner 108 determines an impedance of the battery 104 based on the battery-related conditions 114, as observed or expected conditions for the current or next cycle of the battery 104. The battery-related conditions 114 may include a cycle count of the battery 104, a temperature condition at the battery 104, or both. The temperature condition may include an expected temperature at the battery 104 during a current cycle or a next cycle of the battery 104. Further, the expected temperature may be based on a location of the electronic device 102, a planned location of the electronic device 102, or a temperature at the battery 104 during a previous cycle. Additionally or alternatively, the electronic device 102 may determine the impedance of the battery 104 by measuring the current impedance of the battery 104.

At operation 704, the electronic device determines a voltage margin for voltage transients. The margin for voltage transients is based, at least in part, on the impedance of the battery. For example, the margin 510 can be based on a product of a current draw of an operation of the electronic device 102 and the impedance of the electronic device 102. In some implementations, the current draw used in the product is a current draw of a highest expected current-drawing operation of the electronic device (peak transient current), such as capturing and processing a photo.

At operation 706, the electronic device sets a shut-down voltage for the electronic device, based on the margin for voltage transients. For example, the shut-down manager 110 sets the shut-down voltage 508 based on the margin 510.

At optional operation 708, the electronic device updates the shut-down voltage for the electronic device based on an updated determination of impedance of the battery. For example, the battery manager 106 repeats the operations 702 and 704 and determines that the shut-down voltage 508 should be updated based on updated the battery-related conditions 114 or a change in the peak transient current.

FIG. 8 illustrates an example method 800 performed by an electronic device for battery state estimation. The method 800 includes operations that may be performed by one or more of the battery manager 106, the impedance determiner 108, or the shut-down manager 110. In some aspects, operations of the method 800 may improve battery use of an electronic device by calibrating a shut-off voltage based on battery-related conditions.

At operation 802, an electronic device determines an impedance of a battery of the electronic device. The electronic device determines the impedance based on conditions at the battery. For example, the impedance determiner 108 determines an impedance of the battery 104 based on the battery-related conditions 114, as observed or expected conditions for the current or next cycle of the battery 104. As discussed above, the battery-related conditions 114 may include a cycle count of the battery 104, a temperature condition at the battery 104, or both. The temperature condition may include an expected temperature at the battery 104 during a current cycle or a next cycle of the battery 104.

At operation 804, the electronic device determines a current draw of an available operation of the electronic device. For example, the battery manager 106 determines current draws for the available operations of the electronic device 102. The battery manager 106 may determine a peak transient current based on a highest current-drawing operation of the electronic device 102.

At operation 806, the electronic device determines a voltage margin for voltage transients. For example, the margin 510 is based on the impedance of the battery 104 and the current draw of the available operation of the electronic device 102. The margin 510 can be based on a product of the current draw of the available operation of the electronic device 102 and the impedance of the electronic device 102.

At operation 808, the electronic device sets a shut-down voltage for the electronic device, based on a sum of the voltage margin for voltage transients and a UVLO voltage level. For example, the shut-down manager 110 sets the shut-down voltage 508 based on the margin 510. The margin 510 may also include a buffer amount of voltage to buffer against incorrect estimations of the battery-related conditions 114. Additionally or alternatively, setting the shut-down voltage for the electronic device 102 may include updating a previous shut-down voltage for the battery 104.

At optional operation 810, the electronic device updates the shut-down voltage for the electronic device based on an updated determination of impedance of the battery. For example, the battery manager 106 repeats the operations 802-806 and determines that the shut-down voltage 508 should be updated based on a change of the battery-related conditions 114 or a change in the peak transient current. The battery manager may be configured to determine updated battery related conditions 114 in response to charging the battery 114 or a change in power settings of the electronic device 102 (e.g., entering or exiting a low power mode).

FIG. 9 illustrates an example method 900 performed by an electronic device for battery state estimation. The method 900 includes operations that may be performed by one or more of the battery manager 106, the impedance determiner 108, or the state-of-charge manager 112. In some aspects, operations of the method 900 may improve battery use of an electronic device by providing an indication of the state-of-charge of the battery 104 based on battery-related conditions.

At operation 902, an electronic device determines conditions at a battery of the electronic device. The conditions include one or more of a cycle count of the battery or a temperature condition at the battery. The temperature condition may include observed or expected conditions for the current or next cycle of the battery. For example, the battery manager 106 uses one or more of the cycle counter 212, the behavior predictor 214 or the temperature condition manager 216 to determine the battery-related conditions 114.

At operation 904, the electronic device determines an impedance of the battery. The electronic device determines the impedance based on the conditions at the battery. For example, the impedance determiner 108 determines an impedance of the battery 104 based on the battery-related conditions 114, as observed or expected conditions for the current or next cycle of the battery 104. As discussed above, the battery-related conditions 114 may include a cycle count of the battery 104, a temperature condition at the battery 104, or both. The temperature condition may include an expected temperature at the battery 104 during a current cycle or a next cycle of the battery 104.

At operation 906, the electronic device determines a state-of-charge of the battery based on the impedance of the battery. For example, the battery manager 106 determines the shut-down voltage 508 for the electronic device 102 based on the impedance. The battery manager 106 uses the shut-down voltage 508 to determine a state-of-charge of the battery, relative to the shut-down voltage 508 and a full-charge voltage of the battery 104.

At operation 908, the electronic device provides an indication of the state-of-charge of the battery. For example the I/O interface 208 provides a visual or audio indication of the state-of-charge of the battery 104.

At optional operation 910, the electronic device updates the state-of-charge of the battery based on an updated determination of impedance of the battery. For example, after providing the indication of the state-of-charge, the battery manager 106 determines updates conditions at the battery 104, determines an updated impedance of the battery 104, determines an updated state-of-charge, and provides an updated indication of the state-of-charge.

Example Computing System

Figure 10:
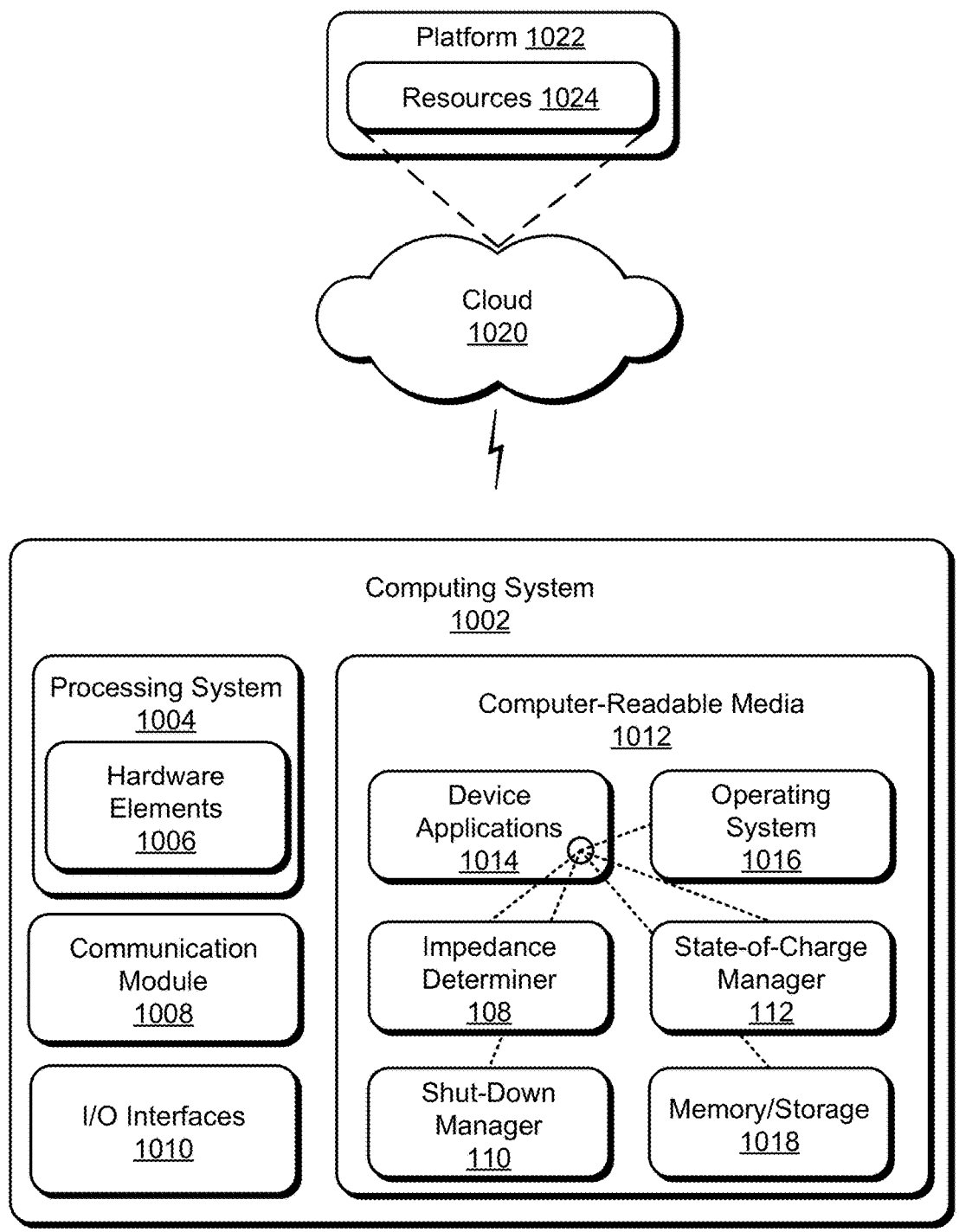
FIG. 10 illustrates an example operating environment that can implement, or in which techniques may be implemented that enable, battery state estimation.

FIG. 10 illustrates an example operating environment 1000 that can implement, or in which techniques may be implemented that enable, battery state estimation. The operating environment 1000 illustrates various components of an example computing system 1002 that can be implemented as any type of electronic device as described with reference to the previous FIGS. 1-9 to implement battery state estimation.

The computing system 1002 includes a processing system 1004 (e.g., any of microprocessors, controllers, or other controllers) that can process various computer-executable instructions to control the operation of the computing system 1002 and to enable techniques for, or in which can be implemented, battery state estimation. Alternatively or additionally, the computing system 1002 can be implemented with any one or combination of hardware elements 1006, firmware, or fixed logic circuitry that is implemented in connection with processing and control circuits. Although not shown, the computing system 1002 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The computing system 1002 also includes a communication module 1008 that enables wired and/or wireless communication of data (e.g., external data). The communication module 1008 can be implemented as one or more of a serial and/or parallel interface, a wireless interface, any type of network interface, a modem, or as any other type of communication interface. The communication module 1008 provides a connection and/or communication links between the computing system 1002 and a communication network by which other electronic, computing, and communication devices communicate data with the computing system 1002.

The computing system 1002 includes I/O interfaces 1010 for receiving and providing data. For example, the I/O interfaces 1010 may include one or more of a touch-sensitive input, a capacitive button, a microphone, a keyboard, a mouse, an accelerometer, a display, an LED indicator, a speaker, or a haptic feedback device.

The computing system 1002 also includes computer-readable media 1012, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewritable compact disc (CD), any type of a digital versatile disc (DVD).

The computer-readable media 1012 provides data storage mechanisms to store various device applications 1014, an operating system 1016, and memory/storage 1018 and any other types of information and/or data related to operational aspects of the computing system 1002. For example, an operating system 1016 can be maintained as a computer application within the computer-readable media 1012 and executed on the processing system 1004. The device applications 1014 may include a device manager, such as any form of a control application, software application, or signal-processing and control modules. The device applications 1014 may also include system components, engines, or managers to implement battery state estimation, such as an impedance determiner 108, a shut-down manager 110, or a state-of-charge manager 112. The computing system 1002 may also include, or have access to, one or more machine learning systems.

Using the communication module 1008, the computing system 1002 may communicate via a cloud computing service (cloud) 1020 to access a platform 1022 having resources 1024. In some implementations, one or more of the impedance determiner 108, a shut-down manager 110, or a state-of-charge manager 112 are located at the resources 1024 and are accessed by the computing system 1002 via the cloud 1020.

Further to the descriptions above, a user may be provided with controls allowing the user to make an election as to both if and when systems, programs or features described herein may enable collection of user information (e.g., information about a user's social network, social actions or activities, profession, a user's preferences, a user's current location, a user's calendar schedule, or a user's scheduled activities), and if the user is sent content or communications from a server. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over what information is collected about the user, how that information is used, and what information is provided to the user.

CONCLUSION

Although implementations of techniques for, and apparatuses enabling, battery state estimation have been described in language specific to features and/or methods, it is to be understood that the subject of the appended claims is not necessarily limited to the specific features or methods described. Rather, the specific features and methods are disclosed as example implementations enabling battery state estimation.

What is claimed is:

1. A method for setting a shut-down voltage for a battery of an electronic device, the method comprising:
   determining, by the electronic device, an expected impedance of the battery, the determining based on expected conditions at the battery, the expected conditions including at least two of a current temperature of an expected location of the electronic device, an expected temperature of the current location or the expected location of the electronic device, the current location of the electronic device, the expected location of the electronic device, or expected behavior of a user of the electronic device;
   determining, based on the expected impedance of the battery, a voltage margin for voltage transients;
   setting, by the electronic device, the shut-down voltage for the electronic device, the shut-down voltage based on a sum of the voltage margin for voltage transients and an undervoltage lockout voltage level.

2. The method of claim 1, wherein determining the expected impedance of the battery further includes determining a cycle count of the battery.

3. The method of claim 1, wherein determining the expected impedance of the battery further includes determining an expected temperature condition at the battery during a current cycle or a next cycle of the battery.

4. The method of claim 3, wherein the expected temperature is based on a lowest temperature of a plurality of expected temperatures at the battery during the current cycle or the next cycle.

5. The method of claim 1, wherein the setting of the shut-down voltage for the battery includes updating a previous shut-down voltage for the battery.

6. The method of claim 1, wherein the expected conditions at the battery further include input received from the user of the electronic device.

7. The method of claim 1, wherein the electronic device determines the expected temperature at the battery based on a temperature at the battery during a previous cycle.

8. The method of claim 1, wherein determining the expected impedance of the battery includes measuring the impedance at the battery.

9. The method of claim 1, wherein the electronic device determines the voltage margin for voltage transients based on a product of a peak transient current and the expected impedance of the battery.

10. An electronic device, comprising:
    one or more computer processors;
    a battery; and
    one or more non-transitory computer-readable media having instructions stored thereon that, responsive to execution by the one or more computer processors, implement a battery manager configured to:
    determine an expected impedance of the battery, the determining based on expected conditions at the battery, the expected conditions including at least two of a current temperature of an expected location of the electronic device, an expected temperature of the current location or the expected location of the electronic device, the current location of the electronic device, the expected location of the electronic device, or expected behavior of a user of the electronic device;
    determine a current draw of an available operation of the electronic device;
    determine, based on the expected impedance of the battery and the current draw of the available operation, a voltage margin for voltage transients; and
    set a shut-down voltage for the electronic device, the shut-down voltage based on a sum of the voltage margin for voltage transients and an undervoltage lockout voltage level.

11. The electronic device of claim 10, wherein the expected conditions further include one or more of a cycle count of the battery.

12. The electronic device of claim 10, wherein the setting of the shut-down voltage for the battery includes updating a previous shut-down voltage for the battery.

13. The electronic device of claim 10, wherein the conditions at the battery includes an expected temperature at the battery during a current cycle or a next cycle of the battery.

14. The electronic device of claim 13, wherein the expected temperature is based on a lowest temperature of a plurality of expected temperatures at the battery during the current cycle or the next cycle.

15. An electronic device, comprising:
    one or more computer processors;
    a battery;
    an I/O interface; and
    one or more non-transitory computer-readable media having instructions stored thereon that, responsive to execution by the one or more computer processors, implement a battery manager configured to:
    determine expected conditions at the battery, the expected conditions including at least two of a current temperature of an expected location of the electronic device, an expected temperature of the current location or the expected location of the electronic device, the current location of the electronic device, the expected location of the electronic device, or expected behavior of a user of the electronic device;
    determine, based on the expected conditions at the battery, an expected impedance of the battery;
    determine, based on the expected impedance of the battery, a shut-down voltage for the electronic device, the shut-down voltage based on a sum of a voltage margin for voltage transients and an undervoltage lockout voltage level;
    determine, based on the shut-down voltage for the electronic device, a state-of-charge of the battery; and
    provide, via the I/O interface, an indication of the state-of-charge of the battery.

16. The electronic device of claim 15, wherein the battery manager is further configured, after providing the indication of the state-of-charge, to:
    determine updated expected conditions at the battery;
    determine an updated expected impedance of the battery;
    determine an updated state-of-charge; and
    provide an updated indication of the state-of-charge.

17. The electronic device of claim 16, wherein the battery manager is configured to determine the updated expected conditions at the battery in response to charging the battery.

18. The electronic device of claim 16, wherein the battery manager is configured to determine the updated expected conditions at the battery in response to a change in power settings.

19. The electronic device of claim 15, wherein the state-of-charge is calculated relative to a shut-down voltage and a full-charge voltage of the battery.

20. The electronic device of claim 15, wherein the expected conditions at the battery further include input received from a user of the electronic device.

* * * * *